United States Patent
Hsu

(10) Patent No.: US 8,324,972 B2
(45) Date of Patent: Dec. 4, 2012

(54) FRONT-END CIRCUIT OF LOW SUPPLY-VOLTAGE MEMORY INTERFACE RECEIVER

(75) Inventor: Ying-Yu Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/077,600

(22) Filed: Mar. 31, 2011

(65) Prior Publication Data
US 2012/0249247 A1 Oct. 4, 2012

(51) Int. Cl.
*H03F 3/04* (2006.01)
(52) U.S. Cl. ........................ 330/297; 330/253
(58) Field of Classification Search ................. 330/297, 330/253, 257, 261
See application file for complete search history.

(56) References Cited

U.S. PATENT DOCUMENTS

| | | |
|---|---|---|
| 5,371,474 A | 12/1994 | Wassenaar et al. |
| 6,563,746 B2 * | 5/2003 | Fujioka et al. ............ 365/189.09 |
| 7,002,329 B2 * | 2/2006 | Agari et al. .................... 323/284 |
| 2007/0247931 A1 * | 10/2007 | Kim ......................... 365/189.09 |
| 2008/0061881 A1 * | 3/2008 | Takagi .......................... 330/261 |

OTHER PUBLICATIONS

Bazes, M., "Two Novel Fully Complementary Self-Biased CMOS Differential Amplifiers," IEEE Journal of Solid-State Circuits, vol. 26, No. 2., Feb. 1991, pp. 165-168.

* cited by examiner

*Primary Examiner* — Henry Choe
(74) *Attorney, Agent, or Firm* — Slater & Matsil, L.L.P.

(57) ABSTRACT

A circuit includes a reference voltage generator configured to generate a first reference voltage and a second reference voltage, wherein the first reference voltage is higher than a half of a positive power supply voltage, and the second reference voltage is lower than the half of the positive power supply voltage. An n-type differential amplifier includes a first and a second NMOS transistor, wherein a gate of the first NMOS transistor is coupled to an input node, and a gate of the second NMOS transistor is configured to receive the first reference voltage. A p-type differential amplifier is operated by the positive supply voltage and includes a first and a second PMOS transistor. A gate of the first PMOS transistor is coupled to the input node, and a gate of the second PMOS transistor is configured to receive the second reference voltage.

18 Claims, 3 Drawing Sheets

FRONT-END CIRCUIT OF LOW SUPPLY-VOLTAGE MEMORY INTERFACE RECEIVER

BACKGROUND

The front-end circuits of memory interface receivers have the function of converting the signals received from memories into logic high and logic low signals that can be used by core circuits. The front-end circuits of memory interface receivers are sometimes referred to as amplifiers since they amplify small-swing signals as signals with greater swings.

With the advancement of the memory interface specification, there is an increasingly demanding requirement for improving power supply voltage compatibility so that the front-end circuits may work properly under various power supply voltages, such as 1.5V, 1.2V, and 1.0V. The speed target for the front-end circuits, on the other hand, also increases. Designing the front-end circuits that meet the demanding specification thus becomes more and more difficult. The difficulty in the design is further increased due to the process variations that may cause the shift in threshold voltages in the MOS transistors used in the front-end circuits, and due to the variation in the reference voltages and power supply voltages used by the front-end circuits.

There were some conventionally used front-end circuits of memory interface receivers, such as complementary self-bias differential amplifiers. This type of amplifiers was popular since they do not need bias. Furthermore, with their push-pull characteristic, the rising delay and the falling delay match with each other, resulting in a small duty mismatch. Typically, this type of amplifiers may work at a power supply voltage greater than about 1.8V (for example 1.8V to 2.5V), and the work frequency may be up to about 1 Gbps.

Complementary self-bias differential amplifiers, however, have cascade structures, and may have four MOS transistors cascaded in some circuits. Accordingly, when the threshold voltages of the MOS transistors are high (which may be caused by process variations), there is not enough headroom for threshold voltages. The operation speed is also low.

Conventionally used front-end circuits also include pseudo differential amplifiers, which may be of either p-type or n-type. Again, this type of front-end circuits were popular since they do not need bias, and the headroom for threshold voltages is increased over that of complementary self-bias differential amplifiers. Typically, this type of front-end circuits may work at a power supply voltage as low as about 1.2V, and the work frequency may be up to about 2 Gbps.

Pseudo differential amplifiers, however, need to have the input signal compared with a reference voltage, which may be a half of the power supply voltage. Accordingly, due to the single-ended characteristic, at very low power supply voltages, the headroom is still tight, and the operation speed is not high enough. Further, a pseudo differential amplifier is either p-type or n-type, and hence there may be a serious rising/falling delay mismatch, which leads to duty skew.

Another type of amplifiers uses P-N-type dual inputs combined with current minor summation. This type of front-end circuits uses a p-type amplifier and an n-type amplifier. An input signal and a reference voltage are provided to each of the p-type amplifier and the n-type amplifier, and the currents generated by the p-type amplifier and the n-type amplifier are summed. Typically, this type of front-end circuits may work at a power supply voltage as low as about 1.2V, and the work frequency may be up to about 5 Gbps.

Again, for this type of front-end circuits, the headroom for threshold voltage is low when the power supply voltage is low, for example, close to about 1.0V. Furthermore, the reference voltage may suffer from variations, which sometimes cause the reference voltage to be lower than the threshold voltage of the MOS transistors in the p-type amplifier and the n-type amplifier. This may lead to operation failure or a low operation speed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A front-end circuit, which may be a part of a low voltage memory interface receiver, is provided in accordance with an embodiment. The variations and the operation of the embodiment are then discussed. Throughout the various views and illustrative embodiments, like reference numbers are used to designate like elements.

Figure 1:
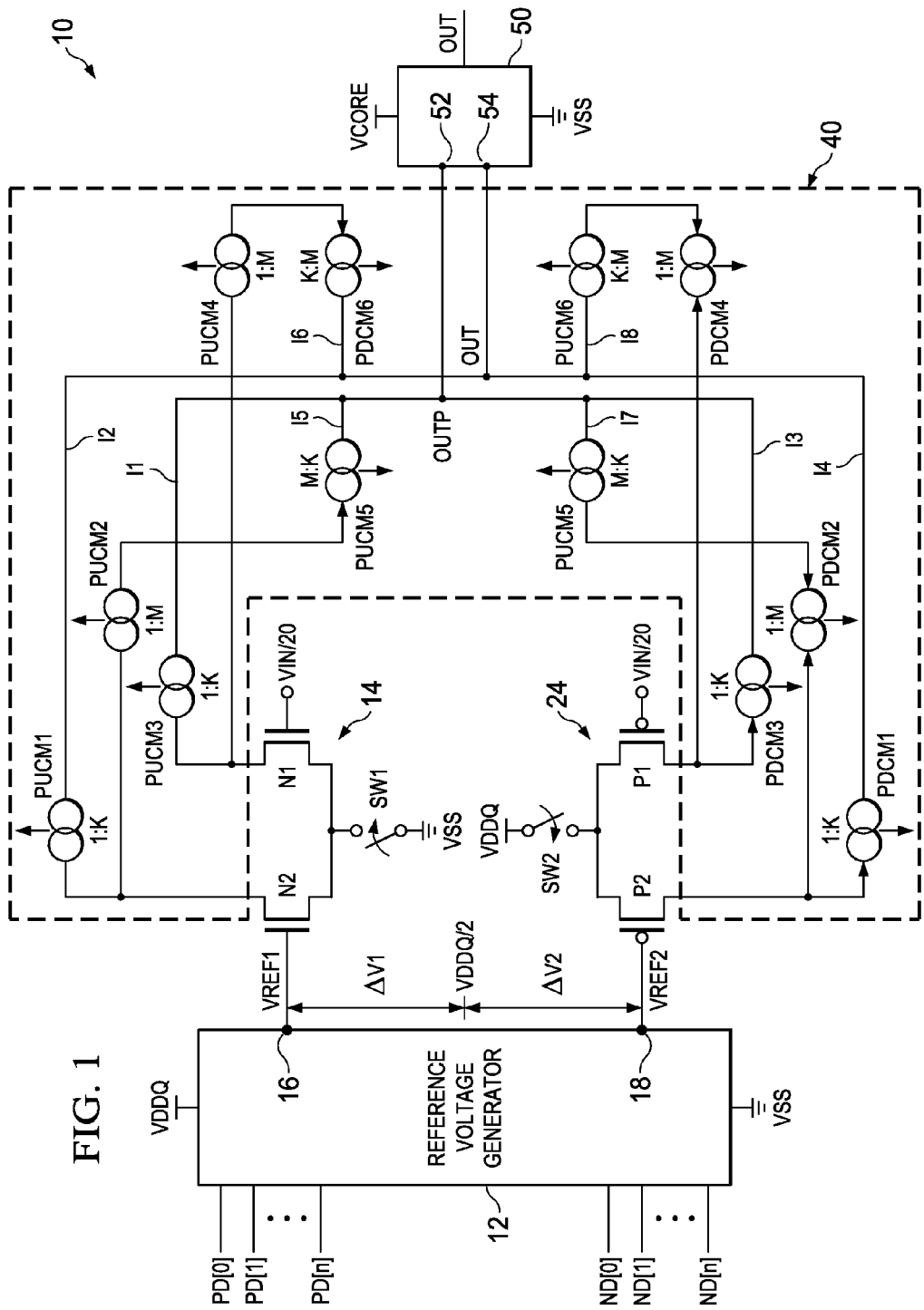
FIG. 1 illustrates a circuit diagram of a front-end circuit in accordance with an embodiment.

FIG. 1 illustrates a circuit diagram of front-end circuit 10 (which is sometimes referred to as an amplifier) in accordance with an embodiment. The circuit includes reference voltage generator 12, which may be coupled to positive power supply voltage (for example, VDDQ) and power supply voltage VSS. Power supply voltage VSS may be the electrical ground. Reference voltage generator 12 generates reference voltages VREF1 and VREF2, with reference voltage VREF2 being lower than reference voltage VREF1. Reference voltages VREF1 and VREF2 are sent to output nodes 16 and 18, respectively. Reference voltage VREF1 may be greater than a half (referred to as half-power supply voltage VDDQ/2 hereinafter) of power supply voltage VDDQ, and the difference VREF1−VDDQ/2 is referred to as ΔV1. Reference voltage VREF2 may be lower than half-power supply voltage VDDQ/2, and the difference VDDQ/2−VREF2 is referred to as ΔV2. Reference voltage VREF1 may be adjusted, for example, by adjusting digital control codes PD[0] through PD[n] (with n being an integer) that are provided to reference voltage generator 12. Reference voltage VREF2 may be adjusted, for example, by adjusting digital control codes ND[0] through ND[n] that are provided to reference voltage generator 12. Reference voltage generator 12 generates reference voltage VREF1 in response to the value of digital control codes PD[0] through PD[n], and reference voltage VREF2 in response to the value of digital control codes ND[0] through ND[n]. In an exemplary embodiment, voltages ΔV1 and ΔV2 are between zero percent and about 20 percent half-power supply voltage VDDQ/2 (VREF), although they may be adjusted to different values.

Front-end circuit 10 further comprises n-type differential amplifier 14, which includes NMOS transistors N1 and N2. The gate of NMOS transistor N1 is connected to input node 20, through which input signal IN is provided. In an embodiment, input signal VIN is a small swing signal swinging between, for example, about 0.2 V and about 0.4 V. The gate of NMOS transistor N2 is connected to output node 16 to receive reference voltage VREF1. The sources of NMOS transistor N1 and N2 may be interconnected, and may be coupled to power supply node VSS (at power supply voltage VSS) through switch SW1. The drains of NMOS transistor N1 and N2 are connected to current mirror summation circuit 40.

Front-end circuit 10 further comprises p-type differential amplifier 24, which includes PMOS transistors P1 and P2. The gate of PMOS transistor P1 is connected to input node 20. The gate of PMOS transistor P2 is connected to output node 18 to receive reference voltage VREF2. The sources of PMOS transistor P1 and P2 may be interconnected, and may be coupled to power supply node VDDQ (at power supply voltage VDDQ) through switch SW2. The drains of PMOS transistor P1 and P2 are connected to current mirror summation circuit 40. During the operation of front-end circuit 10, switches SW1 and SW2 are closed so that currents can flow through PMOS transistor P1 and P2 and NMOS transistor N1 and N2.

Current minor summation circuit 40 receives the currents provided by NMOS transistors N1 and N2 and the currents provided by PMOS transistors P1 and P2, and generates summation currents flowing through differential output nodes OUTP and OUTN. Current minor summation circuit 40 further includes a plurality of pull-up current mirrors PUCM1 through PUCM6 and a plurality of pull-down current mirrors PDCM1 through PDCM6. Furthermore, the exemplary current ratios (for example, 1:K, 1:M, and M:K) are marked for each of the current minors. Each of values M and K may be any positive value that are greater than or equal to about 1, although they may be smaller than 1.

Figure 2:
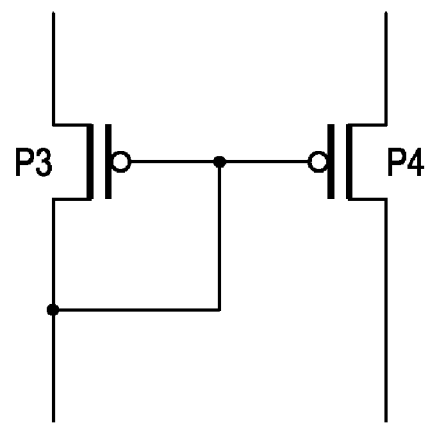
FIGS. 2 and 3 are exemplary implementations of pull-up and pull-down current minors used in the front-end circuit.

FIG. 2 illustrates the implementation of exemplary pull-up current minors PUCM1 through PUCM6, which are powered by power supply voltage VDDQ (not shown in FIG. 2, please refer to FIG. 1). It is appreciated that other current mirror implementations may be used. Each of pull-up current mirrors PUCM1 through PUCM6 may include a first PMOS transistor (marked as P3) and a second PMOS transistor (marked as P4) having their gates interconnected, with the gate and the drain of PMOS transistor P3 being interconnected, or the gate and the drain of PMOS transistor P4 being interconnected.

Figure 3:
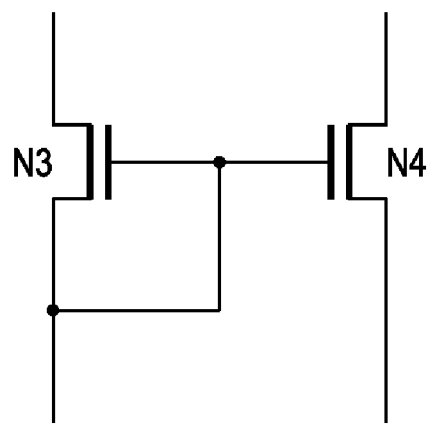

FIG. 3 illustrates the implementation of exemplary pull-down current mirrors PDCM1 through PDCM6, which are powered by power supply voltage VDDQ (not shown in FIG. 3, please refer to FIG. 1). Each of pull-down current mirrors PDCM1 through PDCM6 may include a first NMOS transistor (marked as N3) and a second PMOS transistor (marked as N4) having their gates interconnected, with the gate and the drain of NMOS transistor N3 being interconnected, or the gate and the drain of NMOS transistor N4 being interconnected.

Referring back to FIG. 1, pull-up current minors PUCM1 and PUCM2 are coupled to the drain of NMOS transistor N2. Pull-up current minors PUCM3 and PUCM4 are coupled to the drain of NMOS transistor N1. Pull-up currents I1 and I2 are provided by pull-up current minor PUCM3 and PUCM1, respectively. Pull-down current mirror PDCM5 converts the pull-up current flowing through pull-up current minor PDCM2 into pull-down current I5. Pull-down current mirror PDCM6 converts the pull-up current flowing out of pull-up current mirror PDCM4 into pull-down current I6. Accordingly, current minor summation circuit 40 generates pull-up current I1 and pull-down current I5 flowing through output node OUTP, and pull-up current I2 and pull-down current I6 flowing through output node OUTN.

Pull-down current mirrors PDCM1 and PDCM2 are coupled to the drain of PMOS transistor P2. Pull-down current minors PDCM3 and PDCM4 are coupled to the drain of PMOS transistor P1. Pull-down current I3 and I4 are provided by pull-down current mirror PDCM3 and PDCM1, respectively. Pull-up current mirror PUCM5 converts the pull-down current flowing through pull-down current mirror PDCM2 into pull-up current I7. Pull-up current minor PUCM6 converts the pull-down current flowing through pull-down current mirror PDCM4 into pull-up current I8. Accordingly, current minor summation circuit 40 generates pull-down current I3 and pull-up current I7 flowing through output node OUTP, and pull-down current I4 and pull-up current I8 flowing through output node OUTN.

Through the interpolation of currents I1 through I8, output voltages VOUTP and VOUTN on differential output nodes OUTP and OUTN, respectively, are differential voltages. Voltage level-down circuit 50 comprises inputs 52 and 54 connected to output nodes OUTP and OUTN, and receives differential output voltages VOUTP and VOUTN, respectively. Voltage level-down circuit 50 may be provided with power supply voltage VCORE, which may be different from, and may be lower than, power supply voltage VDDQ. The output voltage VOUT (at node OUT) of voltage level-down circuit 50 are generated in response to differential output voltages VOUTP and VOUTN. In an exemplary embodiment, when output voltage VOUTP is higher than output voltage VOUTN, output voltage VOUT is a logic high voltage (which may be substantially equal to VCORE), and when output voltage VOUTP is lower than output voltage VOUTN, output voltage VOUT is a logic low voltage (which may be substantially equal to VSS). In alternative embodiments, when output voltage VOUTP is higher than output voltage VOUTN, the output voltage is a logic low voltage.

Output voltage VOUTP is determined by summation current (I1+I7)−(I3+I5). Output voltage VOUTN is determined by summation current (I2+I8)−(I4+I6). Through the interpolation of the currents, even when input voltage VIN is in the grey area that is higher than VREF2 and lower than VREF1, appropriate differential voltages VOUTP and VOUTN may still be generated on output nodes OUTP and OUTN, respectively, and correct output voltage VOUT may be generated on node OUT.

Figure 4:
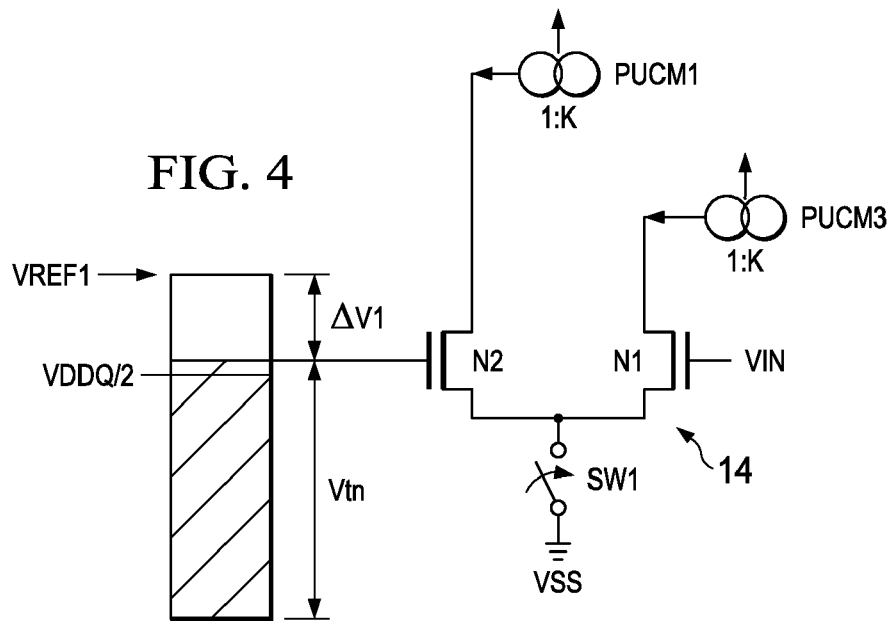
FIGS. 4 and 5 illustrate a portion of the n-type differential amplifier and a portion of the p-type differential amplifier, respectively, wherein the effect of adjusting reference voltages is illustrated.

FIG. 4 illustrates a portion of n-type differential amplifier 14 as shown in FIG. 1. The reference voltage VREF1 is illustrated as being higher than threshold voltage Vtn of NMOS transistor N2. Assuming the shaded area represents threshold voltage Vtn of NMOS transistor N2, if voltage VDDQ/2 (which is illustrated as being equal to or lower than Vtn) is provided to the gate of NMOS transistor N2, a weak turn on may occur to NMOS transistor N2, or NMOS transistor N2 may fail to turn on. By applying reference voltage VREF1, which is VDDQ/2+ΔV1, to the gate of NMOS transistor N2, NMOS transistor N2 may be turned on reliably, and the current of NMOS transistor N2 is increased accordingly. The speed of front-end circuit 10 is also improved. Therefore, the operation of NMOS transistor N2 is no longer limited by the low power supply voltage VDDQ.

Figure 5:
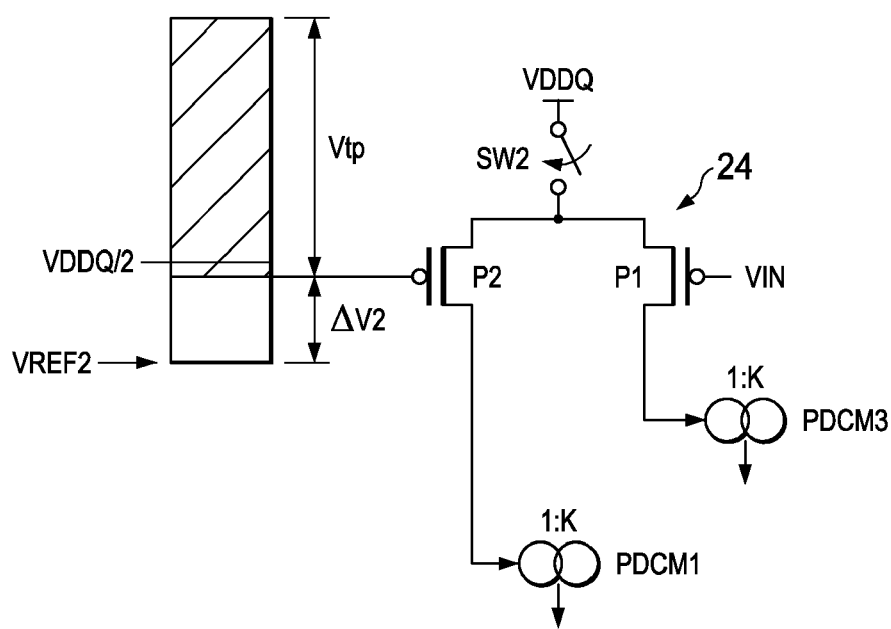

FIG. 5 illustrates a portion of p-type differential amplifier 24 as shown in FIG. 1. The reference voltage VREF2 is illustrated as being lower than threshold voltage Vtp of PMOS transistor P2. Assuming the shaded area represents threshold voltage Vtp of PMOS transistor P2, if voltage VDDQ/2 (which is illustrated as being equal to or lower than Vtp) is provided to the gate of PMOS transistor P2, a weak turn on may occur to PMOS transistor P2, or PMOS transistor P2 may fail to turn on. By applying reference voltage VREF2, which is VDDQ/2−ΔV2, to the gate of PMOS transistor P2, PMOS transistor P2 may be turned on reliably, and the current of PMOS transistor P2 is increased accordingly. The speed of front-end circuit 10 is also improved.

Referring again to FIG. 1, if voltages ΔV1 and ΔV2 are set to be equal to each other, the sum of currents I1 and I7 may be equal to the sum of currents I3 and I5 (FIG. 1), and the sum of currents I2 and I8 may be equal to the sum of currents I4 and I6. Accordingly, the duty mismatch (duty skew) of front-end circuit 10 is minimized or substantially eliminated. It is realized that there may be variety of variations such as process variations (which may cause the variation in the threshold voltages of MOS transistors) and the variation in the power supply voltage (such as VDDQ). Through tuning reference voltages VREF1 and VREF2, the adverse effect to front-end circuit 10 may be minimized.

Simulation results indicated that the embodiments of the present disclosure may operate reliably at power supply voltages as low as 1.0V. Furthermore, the operation of the embodiments is reliable even at high-threshold voltage process corners. The minimum operation speed of the embodiments may achieve 2.5 Gbps, and may be as high as about 5 Gbps. The maximum mismatch of rising/falling delay is about 18 ps. The tolerance to the system reference voltage variation may be about 75 mV to about 100 mV. Accordingly, the embodiments have significantly improved variation tolerance, and may be operated at low power supply voltages without sacrificing the operation speed and reliability.

In accordance with embodiments, a circuit includes a reference voltage generator configured to generate a first reference voltage and a second reference voltage, wherein the first reference voltage is higher than a half of a positive power supply voltage, and the second reference voltage is lower than the half of the positive power supply voltage. An n-type differential amplifier includes a first and a second NMOS transistor, wherein a gate of the first NMOS transistor is coupled to an input node, and a gate of the second NMOS transistor is configured to receive the first reference voltage. A p-type differential amplifier is operated by the positive supply voltage and includes a first and a second PMOS transistor. A gate of the first PMOS transistor is coupled to the input node, and a gate of the second PMOS transistor is configured to receive the second reference voltage.

In accordance with other embodiments, a circuit includes a reference voltage generator comprising a first and a second reference voltage node, wherein the reference voltage generator is configured to output a first reference voltage and a second reference voltage different from the first reference voltage to the first and the second reference voltage nodes, respectively. A first NMOS transistor includes a gate coupled to an input node. A second NMOS transistor includes a gate coupled to the first reference voltage node, and a source interconnected to a source of the first NMOS transistor. A first PMOS transistor includes a gate coupled to the input node. A second PMOS transistor includes a gate coupled to the second reference voltage node, and a source interconnected to a source of the first PMOS transistor. A current mirror summation circuit includes a plurality of current minors coupled to drains of the first and the second PMOS transistors, and coupled to drains of the first and the second NMOS transistors, wherein the current minor summation circuit further comprises a pair of differential output voltage nodes. A voltage level-down circuit includes a pair of inputs coupled to the differential output voltage nodes of the current mirror summation circuit.

In accordance with yet other embodiments, a method includes generating a first reference voltage and a second reference voltage lower than the first reference voltage; and providing an input signal to a gate of a first NMOS transistor. The first reference voltage is provided to a gate of a second NMOS transistor, wherein sources of the first and the second NMOS transistors are interconnected. The input signal is provided to a gate of a first PMOS transistor. The second reference voltage is provided to a gate of a second PMOS transistor, wherein sources of the first and the second PMOS transistors are interconnected. A differential pair of output voltages is generated in response to drain currents of the first and the second PMOS transistors, and in response to drain currents of the first and the second NMOS transistors. The differential pair of output voltages is converted to output-signals comprising a logic high signal and a logic low signal.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
   an input node;
   a reference voltage generator configured to generate a first reference voltage and a second reference voltage, wherein the first reference voltage is higher than a half of a positive power supply voltage, and the second reference voltage is lower than the half of the positive power supply voltage;
   an n-type differential amplifier comprising a first and a second NMOS transistor, wherein a gate of the first NMOS transistor is coupled to the input node, and a gate of the second NMOS transistor is configured to receive the first reference voltage; and
   a p-type differential amplifier operated by the positive supply voltage and comprising a first and a second PMOS transistor, wherein a gate of the first PMOS transistor is coupled to the input node, and a gate of the second PMOS transistor is configured to receive the second reference voltage.

2. The circuit of claim 1, wherein the reference voltage generator further comprises a control code input, and wherein the reference voltage generator is configured to adjust at least one of the first and the second reference voltages in response to a first input signal from the control code input.

3. The circuit of claim 2, wherein the reference voltage generator further comprises an additional control code input, and wherein the reference voltage generator is configured to adjust the first reference voltage in response to the first input signal, and to adjust the second reference voltage in response to a second input signal from the additional control code input.

4. The circuit of claim 1 further comprising:
a current mirror summation circuit comprising a plurality of current mirrors and configured to generate a pair of differential output voltages on a pair of differential output nodes; and
a voltage level-down circuit configured to convert the pair of differential output voltages into an output signal comprising a logic high signal and a logic low signal.

5. The circuit of claim 4, wherein the current mirror summation circuit comprises two level-up current mirrors and two level-down current mirrors configured to provide currents to each of the pair of differential output nodes.

6. The circuit of claim 4, wherein the current mirror summation circuit comprises a level-up current mirror and a level-down current mirror coupled to each of drains of the first and the second NMOS transistors, and a level-up current mirror and a level-down current mirror coupled to each of drains of the first and the second PMOS transistors.

7. The circuit of claim 4, wherein the current mirror summation circuit is configured to receive currents from drains of the first and the second PMOS transistors, and from drains of the first and the second NMOS transistors.

8. The circuit of claim 4, wherein the voltage level-down circuit is operated under an additional positive power supply voltage different from the positive power supply voltage, and wherein the logic high signal has a voltage substantially equal to the additional positive power supply voltage, and the logic low signal has a VSS voltage.

9. The circuit of claim 1, wherein a first difference between the first reference voltage and the half of the positive power supply voltage is substantially equal to a second difference between the half of the positive power supply voltage and the second reference voltage.

10. A circuit comprising:
an input node;
a reference voltage generator comprising a first and a second reference voltage node, wherein the reference voltage generator is configured to output a first reference voltage and a second reference voltage different from the first reference voltage to the first and the second reference voltage nodes, respectively;
a first NMOS transistor comprising a gate coupled to the input node;
a second NMOS transistor comprising a gate coupled to the first reference voltage node, and a source interconnected to a source of the first NMOS transistor;
a first PMOS transistor comprising a gate coupled to the input node;
a second PMOS transistor comprising a gate coupled to the second reference voltage node, and a source interconnected to a source of the first PMOS transistor;
a current mirror summation circuit comprising a plurality of current mirrors coupled to drains of the first and the second PMOS transistors, and coupled to drains of the first and the second NMOS transistors, wherein the current mirror summation circuit further comprises a pair of differential output voltage nodes, and wherein the plurality of current mirrors in the current mirror summation circuit comprises two level-up current mirrors and two level-down current mirrors configured to provide currents to each of the pair of differential output nodes; and
a voltage level-down circuit comprising a pair of inputs coupled to the differential output voltage nodes of the current mirror summation circuit.

11. The circuit of claim 10, wherein sources of the first and the second PMOS transistors are coupled to a power supply node with a positive power supply voltage, and wherein the first reference voltage is higher than a half of the positive power supply voltage and lower than the positive power supply voltage, and the second reference voltage is lower than the half of the positive power supply voltage and higher than a VSS voltage coupled to sources of the first and the second NMOS transistors.

12. The circuit of claim 10, wherein the voltage level-down circuit is configured to convert the voltages on the differential output voltage nodes to output-voltages comprising a logic high signal and a logic low signal, with the logic high signal at a voltage close to a positive power supply voltage of the voltage level-down circuit, and the logic low signal close to a VSS voltage.

13. The circuit of claim 10, wherein the reference voltage generator further comprises a control code input, and wherein the reference voltage generator is configured to adjust at least one of the first and the second reference voltages in response to an input signal from the control code input.

14. The circuit of claim 10, wherein the plurality of current mirrors in the current mirror summation circuit comprises a level-up current mirror and a level-down current mirror coupled to each of drains of the first and the second NMOS transistors, and a level-up current mirror and a level-down current mirror coupled to each of drains of the first and the second PMOS transistors.

15. A method comprising:
generating a first reference voltage and a second reference voltage lower than the first reference voltage;
adjusting the first and the second reference voltages through adjusting control codes that are provided to a circuit for generating the first and the second reference voltages;
providing an input signal to a gate of a first NMOS transistor;
providing the first reference voltage to a gate of a second NMOS transistor, wherein sources of the first and the second NMOS transistors are interconnected;
providing the input signal to a gate of a first PMOS transistor;
providing the second reference voltage to a gate of a second PMOS transistor, wherein sources of the first and the second PMOS transistors are interconnected;
generating a differential pair of output voltages in response to drain currents of the first and the second PMOS transistors, and in response to drain currents of the first and the second NMOS transistors; and
converting the differential pair of output voltages to output-signals comprising a logic high signal and a logic low signal.

16. The method of claim 15, wherein sources of the first and the second PMOS transistors are connected to a positive power supply voltage, and sources of the first and the second NMOS transistors are connected to a VSS voltage.

17. The method of claim 16, wherein the first reference voltage is higher than a half of the positive power supply voltage and lower than the positive power supply voltage, and the second reference voltage is lower than the half of the positive power supply voltage and higher than the VSS voltage.

18. The method of claim 15, wherein the step of generating the differential pair of output voltages comprises:

receiving a current from each of drains of the first and the second PMOS transistors, and from each of drains of the first and the second NMOS transistors;

mirroring the current received from each of the drains of the first and the second PMOS transistors and from each of the drains of the first and the second NMOS transistors to generate pull-up currents and pull-down currents;

providing two of the pull-up currents and two of the pull-down currents to a first node to generate the first one of the differential pair of output voltages; and providing additional two of the pull-up currents and additional two of the pull-down currents to a second node to generate the second one of the differential pair of output voltages.

* * * * *